RADIATION SENSITIVE SEMICONDUCTOR DEVICE

Filed Aug. 7, 1964 2 Sheets-Sheet 1

INVENTOR.
PAUL W. KRUSE
BY Robert O. Vidas
ATTORNEY

Sept. 1, 1970 P. W. KRUSE 3,526,801

RADIATION SENSITIVE SEMICONDUCTOR DEVICE

Filed Aug. 7, 1964 2 Sheets-Sheet 2

INVENTOR.
PAUL W. KRUSE
BY Robert O. Vidas
ATTORNEY 3,526,801

RADIATION SENSITIVE SEMICONDUCTOR DEVICE

Paul W. Kruse, Edina, Minn., assignor to Honeywell Inc., Minneapolis, Minn., a corporation of Delaware Filed Aug. 7, 1964, Ser. No. 388,161
Int. Cl. H05b 33/16
U.S. Cl. 313—108 18 Claims

ABSTRACT OF THE DISCLOSURE

A multijunction semiconductor device capable of converting and/or intensifying incident radiation. The device utilizes a heterojunction to convert the wave length of incident radiation and/or a "hook collector" arrangement to provide an internal gain mechanism for high overall quantum efficiency.

This invention relates to radiant energy intensifiers and/or to wave length converters. In particular, this invention relates to a thin film image converter consisting of an integrated device incorporating a semiconductor region for detecting radiation of one wave length, and another semiconductor region for displaying intensified radiation of a different wave length. In one embodiment of the invention, it relates to a junction semiconductor device for intensifying radiation.

A purpose of this invention is to provide a completely integrated, solid state radiation wave length converter which operates in a passive manner utilizing naturally available radiation reflected from terrain and the like. For example, such a device is capable of operating in the passive mode by utilizing available night sky radiation.

Another purpose is to provide a solid state radiation intensifier, particularly for the infrared wave lengths.

It is also a purpose of this invention to provide a solid state radiation converter which intensifies incident radiation as well as converting its wave length.

Radiation converters and intensifiers have been known heretofore in the prior art. Generally, these devices have consisted of a layer of photoconductive material joined to an electroluminescent phosphor. However, the operation of such prior art devices is based on different scientific principles than the present invention. Furthermore, the prior art devices have been found to lack sensitivity at very low light levels and to have long response times, causing rapidly moving targets to be blurred on the display. On the other hand, the present invention offers an improved solid state device in which the detecting and display materials are joined by semiconductor junctions and which offers the additional advantages of having an internal gain mechanism, enhanced spectral response, a passive mode of operation, short response time and low voltage operation.

Semiconductor materials are available which have energy gaps suitable for the detection of radiation. Other semiconductors are also available which have a high efficiency for emitting radiation. By the proper combination of such materials, the purposes of this invention are achieved.

It is an object of this invention to provide a completely integrated solid state radiation wave length converter having a plurality of semiconductor junctions formed between the various regions thereof.

It is another object to provide a device which operates in a passive manner and which is capable of utilizing the night sky radiation reflected from terrain and the like.

Since the detecting and display wave lengths are different in the case of a wave length converter, it is necessary that semiconductor materials of different energy gaps be joined. Consequently, at least one heterojunction must be formed in such a device. Heterojunctions are abrupt transitions from one semiconductor material to another, possible only in certain semiconductor systems in which the lattice structures, lattice constants, and thermal expansion coefficients have nearly equal values. Hence, it is a further object to provide a radiation converter having a heterojunction formed therein which is utilized to accomplish the wave length shifting or conversion of incident radiation.

It is a further object of this invention to provide a radiation converter having internal gain to minimize the loss of carriers in the semiconductor material and to have an amplifying effect on the radiation to be detected.

It is another object to provide a solid state image converter in which the converted radiation can be viewed directly by an observer or which can be received by a device sensitive to the wave length of the converted radiation.

It is yet another object to provide an integrated solid state radiation converter in the form of a thin film composed of several layers.

It is still another object to provide a solid state radiation intensifier.

With this and other objects in view, the invention in its preferred form as a radiation wavelength converter and intensifier broadly embodies a semiconductor device having a heterojunction formed therein between semiconductor materials of different energy gaps and including a pair of electrical contacts formed at opposite ends of the device.

Figure 1:
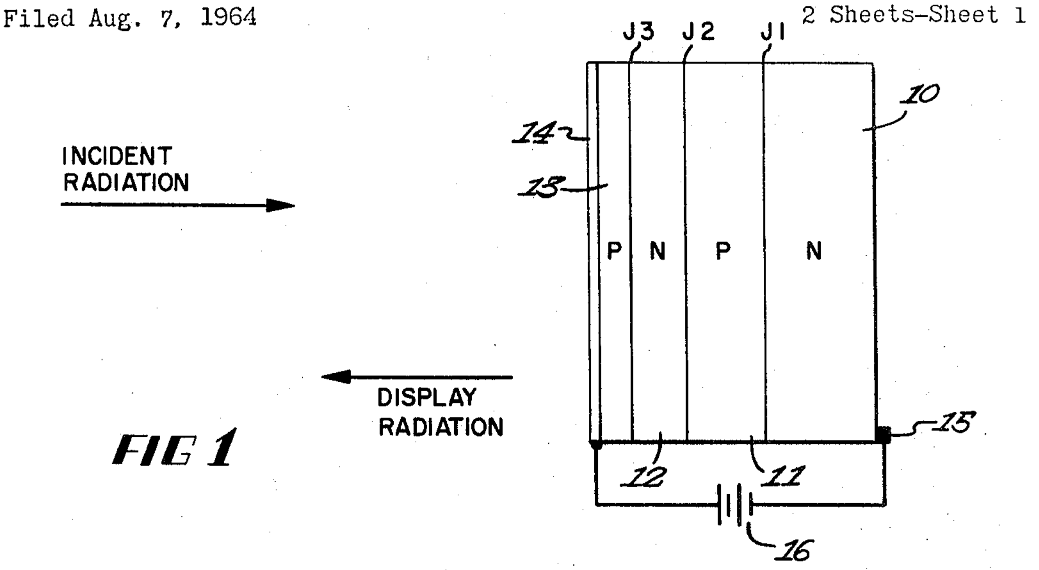
FIG. 1 is a schematic illustration of an embodiment of the invention.

Referring now to the drawings wherein like reference characters denote corresponding parts, FIG. 1 illustrates one embodiment of the invention including layers 10 and 11 of P and N-type germanium respectively. Layers 10 and 11 form a P–N homojunction J1 and when taken together constitute the detecting region of the device. Layer 11 forms a P–N heterojunction J2 with layer 12. Layers 12 and 13 are of N and P-type gallium arsenide respectively. Layers 12 and 13 form a P–N homojunction and when taken together constitute the radiation display region of the device. An electrode 14 makes an ohmic contact to layer 13. Although an ordinary ohmic contact to layer 13 is satisfactory, an ohmic electrode of transparent material covering the entire surface of layer 13 as shown in the drawings is preferred. An ohmic electrode 15 is shown contacting layer 10. By means of electrodes 14 and 15, an electrical bias is impressed upon the device by potential source 16. Incident radiation received by the device is shown impinging upon transparent electrode 14. The display radiation emitted by the device is also shown as leaving the device at transparent electrode 14.

Germanium is employed in this embodiment of the invention as the detecting material, layers 10 and 11, due to the fact that its room temperature absorption edge lies at 1.6 microns, thus enabling the most effective and efficient use of naturally occurring radiation from the night sky. Germanium has the additional advantage of being a highly developed semiconductor material which is easily obtained in single crystal form at whatever impurity concentration is desired. However, other materials, such as silicon, are available which may be substituted for germanium.

It is apparent that the display region, which in the embodiment of FIG. 1 consists of gallium arsenide, must be joined to the germanium region by means of a heterojunction in the case of a radiation converter. Other materials such as gallium phosphide are also capable of use in the display region, depending upon the converted wave length desired. When gallium arsenide is used, it is necessary that a supplemental device be utilized to detect the display radiation since it is not of a visible wave length. With gallium phosphide, the display can be viewed directly since the emission is of visible wave length.

A modification is possible in which the P-gallium arsenide layer is replaced by a wider gap material such as P-gallium phosphide, resulting in the arrangement P-gallium phosphide, N-gallium arsenide, P-germanium, N-germanium. The advantage in such an arrangement is that the P-gallium phosphide layer is transparent to the radiation emitted from the N-gallium arsenide region, and in addition, serves as an efficient wide gap hole emitter into the N-gallium arsenide.

The device as shown possesses a high overall quantum efficiency by means of an internal gain mechanism. The internal gain mechanism is based in part on a "hook" collector type arrangement in accordance with the teachings found on page 114 in the book Electrons and Holes in Semiconductors by William Shockley. Due to the presence of the "hook" arrangement, the absorption of one photon of incident energy can be shown to control a flow of between 100 and 1000 electrons. The manner in which this gain concept can be employed in a thin film image converter may be understood by referring to FIG. 2.

Figure 2:
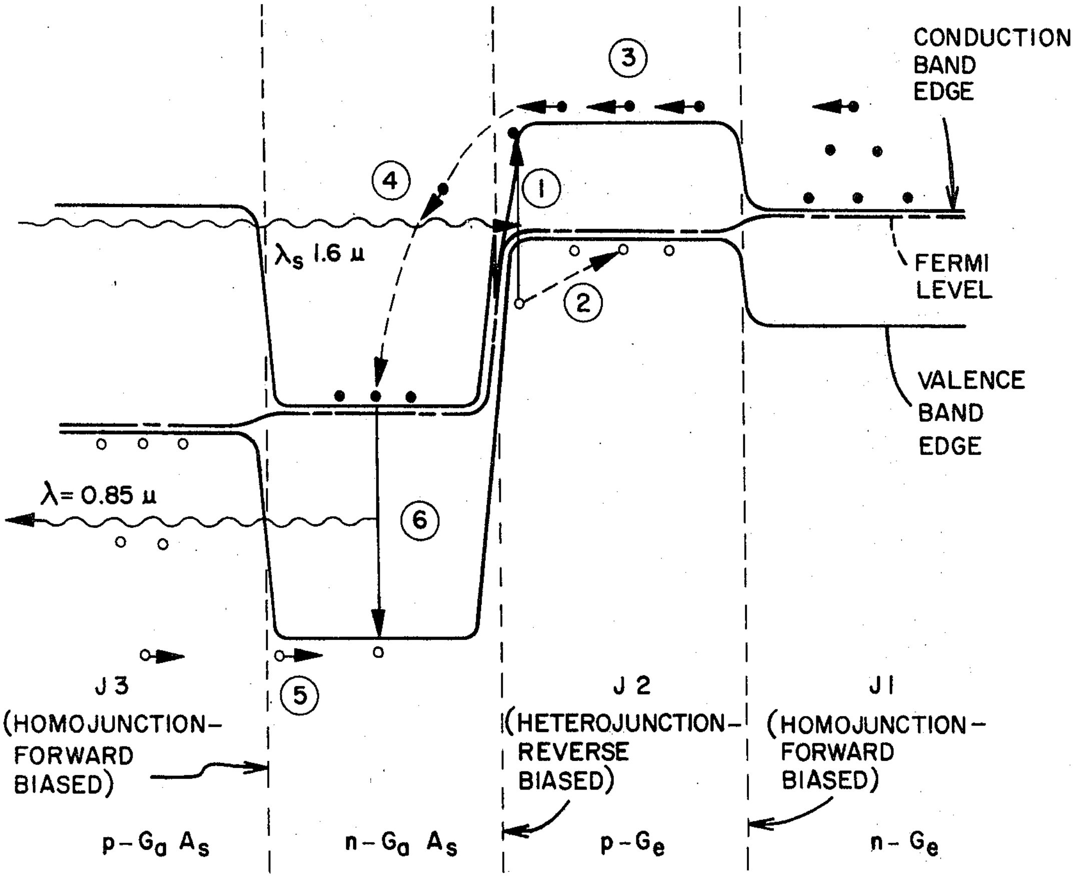
FIG. 2 is an energy level diagram illustrating the various energy levels of the materials shown in the embodiment of FIG. 1.

FIG. 2 is an energy band diagram of the four semiconductor layers of the device of FIG. 1. The vertical broken lines in the diagram indicate the location of the semiconductor junctions J1, J2 and J3 respectively. A DC bias is applied to the device such that layer 13 is positive with respect to layer 10. This causes the Fermi level to decrease from right to left as illustrated. Because the direction of bias is such as to cause the homojunctions J1 and J3 to be forward biased, whereas heterojunction J2 is reverse biased, most of the potential drop occurs across the heterojunction as illustrated.

Consider now the action of radiation upon the device. Germanium absorbs radiation of wave length less than 1.6 microns whereas gallium arsenide is transparent to wave lengths greater than 0.9 micron at room temperature and 0.85 micron as 77° K. The case illustrated is for 77° K. operation. Thus, as shown in FIG. 1, incident radiation of wave length greater than 0.85 micron and less 1.6 microns, will penetrate to heterojunction J2 where it will be strongly absorbed in the germanium layer 11 to a characteristic depth, dependent upon wave length, in the range of 1 micron to 10 microns. Because the N and P-type gallium arsenide layers 12 and 13 are relatively thin, some of the radiation of wave length less than 0.85 micron will also penetrate to the heterojunction and be absorbed, but this amount is not of major importance to the operation of the device.

Aborption of the radiation at heterojunction J2 produces intrinsic excitation of hole-electron pairs in layer 11, step 1 of FIG. 2. The thickness of layer 11 is sufficiently small compared to a minority carrier diffusion length that nearly all electrons entering layer 11 from layer 10 will pass entirely through layer 11. A typical value might be about 50 microns. The holes produced by the photo excitation in layer 11 become trapped in the "hook" in the valence band edge, step 2 of FIG. 2, and cannot enter layer 10. Their presence in layer 11 lowers the barrier to current flow across homojunction J1. If layer 10 is much more heavily doped than layer 11, most of the current carried across homojunction J1 will be carried by electrons, illustrated by step 3 of FIG. 2. Once the electrons penetrate layer 11 and heterojunction J2, diffusion back through the heterojunction is unlikely. This gain mechanism causes a flow of up to several hundred electrons per incident photon.

The presence of the injected electrons in layer 12, step 4, lowers the potential barrier to hole flow from layer 13 into layer 12, step 5, where the injected holes recombine with the free electrons normally present in layer 12, step 6, causing the emission of photons of 0.85 micron wave length. Thus, layer 13 serves as a hole emitter into layer 12, operating as an additional means for increasing gain. Layer 12 must be thick enough that all the injected electrons are collected there, but thin enough so that the recombination radiation easily penetrates the layer.

Since the action of the injected electrons, step 4, is to increase the forward bias on homojunction J3, an equivalent process to step 5 is for electrons to be injected from layer 12 into layer 13, where they recombine radiatively with the thermally excited holes in layer 13.

The four layer device can be prepared by epitaxially growing a lightly doped, thin P-germanium layer 11 on a heavily doped N-germanium substrate, layer 10. The N-germanium serves as one electrode. A thin N-gallium arsenide layer 12 is grown epitaxially on layer 11. A thicker P-gallium arsenide layer 13 is then grown epitaxially on the N-gallium arsenide, layer 12. Electrodes 14 and 15 are then placed on the device to form ohmic contacts.

The dimensions of layers of semiconductor material should be selected in accordance with the following considerations. The main objective in the detecting region is to obtain the highest possible electron current from layer 10 across layer 11 for a given injection of holes generated by radiation in layer 11. The hole injection performs a function analogous to the base current in a transistor. In view of this analogy, to achieve maximum efficiency, one may follow the procedure utilized in maximizing injection efficiency of a germanium transistor. Thus, layer 10 is heavily doped ($10^{19}$—$10^{20}$ cm.$^{-3}$ for example) and layer 11 is lightly doped ($10^{14}$—$10^{15}$ cm.$^{-3}$ for example). Of course, this will vary depending on the semiconductor materials used.

This thickness of layer 11 is subject to certain requirements. Generally, it should be relatively small to:

(1) Maximize the quantum efficiency of the device.
(2) Maximize the collection of injected electrons by the reversed bias heterojunction J2.
(3) Maintain good image definition: i.e., the thickness should be less than the carrier diffusion length of the injected carriers cross homojunction J1 from layer 10 in order to allow the carriers to be collected by heterojunction J2 before diffusion too far in directions perpendicular to the desired current flow direction through the four layers.

Thus, it can be stated that layer 11 should be at least an absorption coefficient thick but less than a minority carrier diffusion length in thickness.

The thickness of layer 10 is not critical insofar as this embodiment of the invention is concerned although in an alternate embodiment to be discussed hereinbelow, the thickness of layer 10 is critical to the operation of the device.

The thickness of layer 13 is subject only to the limitation that it must be relatively thin, on the order of 20 microns or less, in order to transmit the display radiation generated in the device.

Taking into account the various considerations discussed, the actual thickness of an image converter in accordance with this invention is on the order of a few mils overall.

Figure 3:
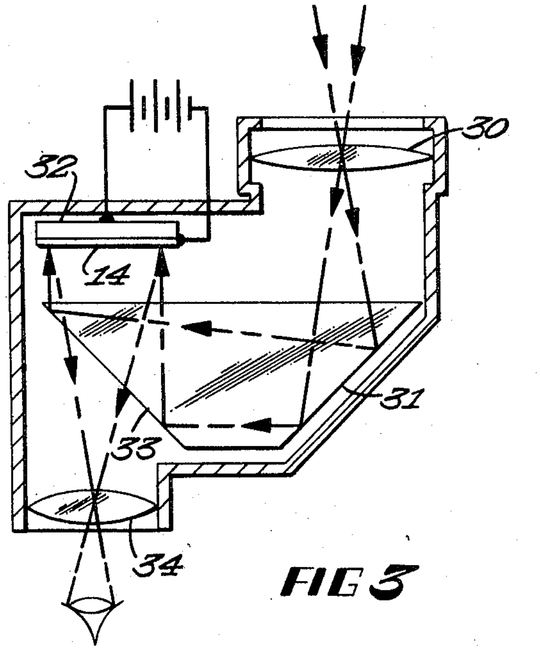
FIG. 3 is a schematic illustration of an optical system for use with the embodiment of the invention shown in FIG. 1.

In operation, due to the intense absorption of radiation by the relatively thick germanium substrate, layer 10, the radiation must enter and leave the device from the same side. A convenient optical system for use with the embodiment of FIG. 1 is shown in FIG. 3. Radiation from the scene viewed is focused by objective lens 30 through a prism to the incident side 14 of the image converter 32. Gallium phosphide is best utilized in the detecting region for the purpose of direct viewing since recombination therein results in visible radiation. By means of a "cold mirror" 33, employing a thin film coating capable of reflecting radiation of wave length greater than 0.85 micron and transmitting that of wave length less than 0.85 micron, radiation from the display region passes through the prism 31 and is imaged by eye piece 34. Such mirrors are well known.

Figure 4:
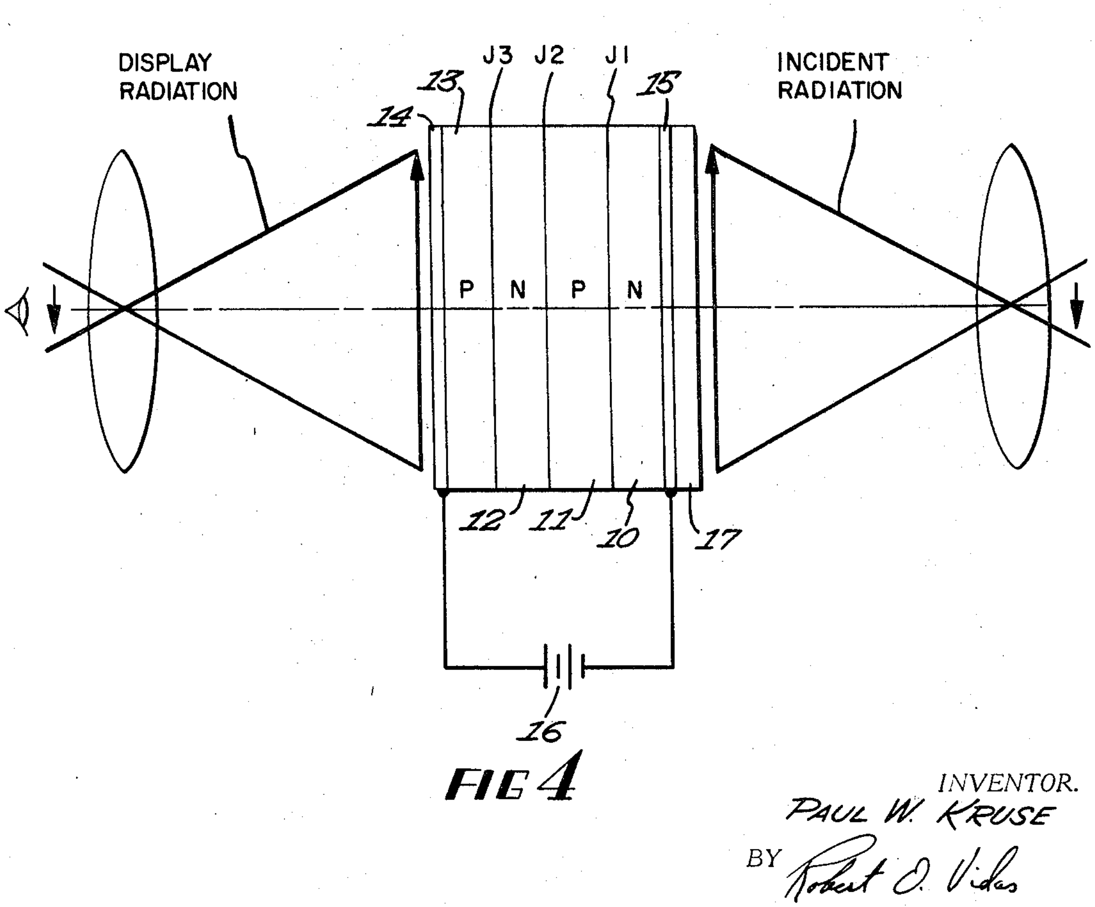
FIG. 4 is a schematic illustration of another embodiment of the invention.

A third embodiment of the device which is less complicated optically is also possible. This embodiment is a see-through type of device, the configuration of which is illustrated in FIG. 4. In this embodiment, the germanium substrate 10 is reduced to a critical dimension to minimize the absorption of incident radiation. However, this arrangement is more difficult to fabricate due to the critical dimension required of layer 10 and the need of a support therefor.

Referring specifically to FIG. 4 in detail, the display portion of the device, consisting of layers 12 and 13 is the same as that discussed for the embodiment described hereinabove except that gallium phosphide is utilized rather than gallium arsenide in order to obtain emitted radiation of a visible wave length. Furthermore, layer 11 is also the same as before. However, layer 10, if controlled in thickness to a dimension smaller than the absorption coefficient of the incident radiation, will allow the device to be operated in a see-through manner. That is, the incident radiation will be allowed to fall on a surface of the germanium and the display radiation will be observed on a surface of the gallium phosphide. In addition, rather than standard ohmic contacts, transparent electrodes may be utilized to optimize the operation of the device. Such electrodes are shown as 14 and 15 in the drawing.

As stated previously, this embodiment has the advantage of optical simplicity, but it has certain disadvantages also. Namely, the germanium substrate layer 10 must in this instance be controlled to a critical thickness and adequate support must be furnished for such a thin layer. Support 17 in this particular embodiment is glass although other materials are available.

While the invention has been described with particular reference to certain embodiments thereof, it will be understood that other modifications may be made within the scope of the art without departing from the scope and spirit of the invention. For example, although the embodiments have been shown in the PNPN configuration, it is obvious that the NPNP configuration is also satisfactory. Also, the resolution of the device may be improved by serrating the display region, attaching large surface area ohmic electrodes, or in other ways known to those skilled in the art.

Furthermore, in accordance with the teaching of this invention a radiation intensifier is also provided if the device is constructed of the same material throughout. For example, a device composed of four layers of gallium arsenide in a P-N-P-N configuration would intensify incident radiation of 1.64 microns. In such a device, only homojunctions are utilized since there is no wave length conversion.

What is claimed is:

1. A device for detecting incident radiation of a given wave length and displaying radiation of a different wave length comprising:

first, second, third and fourth contiguous layers of semiconductor material;

said first layer being of a thickness less than the absorption coefficient of the display radiation and having a surface thereof adapted to receive incident radiation;

said first and second layers forming a first P-N homojunction, said homojunction being substantially parallel to said radiation receiving surface of said first layer;

said first and second layers being of a combined thickness less than the absorption coefficient of the incident radiation;

said second and third layers having different energy gaps and forming a P-N heterojunction therebetween, said heterojunction being substantially parallel to said first P-N homojunction;

said third layer being of a minimum thickness corresponding to the absorption coefficient of said incident radiation and a maximum thickness corresponding to the minority carrier diffusion length in said third layer;

said third and fourth layers forming a second P-N homojunction substantially parallel to said heterojunction;

said fourth layer being relatively heavily doped with respect to said third layer;

an ohmic transparent electrode substantially covering said radiation receiving surface on said first layer and in electrical contact therewith, and an ohmic contact on said fourth layer.

2. The device of claim 1 in which said first and second layers are substantially gallium arsenide and said third and fourth layers are substantially germanium.

3. The device of claim 1 in which said first layer is substantially gallium phosphide, said second layer is substantially gallium arsenide and said third and fourth layers are substantially germanium.

4. A device for detecting incident radiation of a given wave length and displaying radiation of a different wave length comprising:

first, second, third and fourth contiguous layers of semiconductor material;

said first layer being of a thickness less than the absorption coefficient of said displayed radiation and having a surface thereof adapted to display such radiation;

said first and second layers forming a first P-N homojunction, said homojunction being substantially parallel to said display surface;

said second and third layers having different predetermined energy gaps and forming a P-N heterojunction therebetween, said heterojunction being substantially parallel to said first P-N homojunction;

said third and fourth layers forming a second P-N homojunction substantially parallel to said heterojunction, said third and fourth layers being of a combined thickness on the order of the absorption coefficient of said incident radiation;

said fourth layer being adapted to receive said incident radiation on a surface thereof substantially parallel to said first homojunction and being of a thickness less than the absorption coefficient of said incident radiation;

said fourth layer being relatively heavily doped with respect to said third layer, and electrical contacts on said first and fourth layers by means of which said homojunctions may be forward biased and said heterojunction may be reverse biased.

5. The device of claim 4 in which said first and second layers are substantially gallium arsenide and said third and fourth layers are substantially germanium.

6. The device of claim 4 in which said first layer is substantially gallium phosphide, said second layer is substantially gallium arsenide and said third and fourth layers are substantially germanium.

7. A radiation wave length converter for detecting radiation of a given wave length and displaying radiation of a different given wave length, said converter comprising:

a first region of semiconductor material having an energy gap corresponding to the wave length of the radiation to be displayed;

a second region of different semiconductor material having a second energy gap corresponding to the wave length of the radiation to be detected;

a P-N heterojunction formed between said first and second regions;

a P-N homojunction formed in each of said regions respectively, said P-N homojunction being substantially parallel to said heterojunction, and first and second electrodes contacting said first and second regions respectively by which a forward bias may be applied to said homojunctions and a reverse bias may be applied to said heterojunctions, whereby carriers of a first type, formed by said incident radiation in said second region of semiconductor material having said second energy gap, cause the diffusion of a relatively large number of carriers of a second type across said heterojunction into said first region having said first energy gap, where recombination occurs liberating radiation of a different wave length from said incident radiation.

8. The device of claim 7 in which said regions are substantially gallium arsenide and germanium respectively.

9. The device of claim 7 in which said regions are substantially gallium phosphide and germanium respectively.

10. A radiation intensifier comprising:

a first layer of semiconductor material of one conductivity type having substantially oppositely disposed surfaces, said first layer being constructed and arranged to receive impinging radiation on a portion thereof;

second and third layers of semiconductive material of a conductivity type opposite that of said first layer joined to said oppositely disposed surfaces of said first layer to form first and second junctions respectively, said second layer being heavily doped relative to said first layer;

said first layer acting as a "hook collector" in that it acts as a trap for majority carriers generated by impinging radiation in said first layer;

said second layer acting as a source of carriers, which are minority carriers with respect to said first layer, said carriers diffusing through said first and second junctions and said first layer into said third layer in response to the generation of carriers in said first layer;

said third layer acting as a site for recombination of said minority carriers with other carriers to generate radiation;

a fourth layer of semiconductor material of a conductivity type opposite to that of said third layer and joined to said third layer by a third junction which is generally oppositely disposed with respect to said second junction, said fourth layer acting as a source of said other carriers which diffuse through said third junction into said third layer to recombine with said carriers from said second layer, and means for biasing said first and third junctions in the forward direction and second junction in the reverse direction.

11. The device of claim 10 wherein:

said second layer is adapted to receive and transmit said incident radiation to said first junction and said first layer;

said second layer has a thickness corresponding to less than the absorption coefficient of said incident radiation;

said first layer has a minimum thickness corresponding to the absorption coefficient of said incident radiation and a maximum thickness corresponding to the minority carrier diffusion length in said first layer, and said junctions are substantially parallel to each other.

12. The device of claim 10, wherein said layers are all substantially gallium arsenide.

13. A semiconductor radiation wavelength converter comprising:

first and second regions of semiconductor material having contiguous surfaces forming a heterojunction, said heterojunction being adapted to receive incident radiation of a given wavelength in the vicinity thereof whereby carriers are formed in response to said incident radiation;

said second region being constructed to receive and transmit incident radiation to the vicinity of said heterojunction;

said first region having another surface substantially oppositely disposed with respect to said surface which is contiguous with said second region;

a third region of semiconductor material forming a homojunction at said other surface of said first region, and ohmic contacts on said second and third regions by which said heterojunction may be reverse biased and said homojunction may be forward biased.

14. The device of claim 13 wherein:

said first and third regions are substantially gallium arsenide, and said second region is substantially germanium.

15. A semiconductor radiation wavelength converter comprising:

first and second regions of semiconductor material having contiguous surfaces forming a heterojunction, said heterojunction being adapted to receive incident radiation of a given wavelength in the vicinity thereof whereby carriers are formed in response to said incident radiation wherein:

said first region has another surface substantially oppositely disposed with respect to said surface which is contiguous with said second region, and said first region has a minimum thickness corresponding to the absorption coefficient of said incident radiation and a maximum thickness corresponding to the minority carrier diffusion length in said first region, said second region is constructed to receive and transmit incident radiation to said heterojunction and said first region, and said second region has a thickness corresponding to less than the absorption coefficient of said incident radiation;

a third region of semiconductor material forming a homojunction at said other surface of said first region, said homojunction substantially parallel to said heterojunction, and ohmic contacts on said second and third regions by which said heterojunction may be reversed biased and said homojunction may be forward biased.

16. An electroluminescent device comprising a crystalline body having a plurality of p-n junctions and having junction-forming layers of alternately opposite conductivity types, said layers including at least one of said junctions formed by materials having different forbidden-band widths, the forbidden-band width of the material of one of said layers being narrower than that of the material of the other of said layers, means for applying excitation in the material of said one of said layers through the p-n junction with said other of said layers to generate luminescence in the material of said other of said layers.

17. An electroluminescent device comprising a crystalline body having p-n junction-forming layers of respectively different conductivity types, said layers consisting of different materials having respectively different forbidden-band widths, the forbidden-band width of the material of one of said layers being narrower than that of the material of the other of said layers, means for applying excitation in the material of said one of said layers through the p-n junction with the other of said layers to generate luminescence by recombination in the material of said other of said layers.

18. An electroluminescent device as claimed in claim 17 wherein one of said materials comprises a p conductivity type $A_{III}B_V$ semiconductor compound and the other of said materials comprises an n conductivity type $A_{III}B_V$ semiconductor compound.

References Cited

UNITED STATES PATENTS

| | | | |
|---|---|---|---|
| 3,207,939 | 9/1965 | Mason | 313—108 |
| 2,790,088 | 4/1957 | Shine | 250—211 |
| 3,096,442 | 7/1963 | Stewart | 250—217 |
| 3,270,235 | 8/1966 | Loebner | 313—108 |
| 3,283,160 | 11/1966 | Levitt et al. | 250—213 |

OTHER REFERENCES

D–11 "Light Emitting Device with a Quantum Efficiency Greater than Unity," IBM Technical Disclosure Bulletin, vol. No. 2, July 1963, pp. 84–85.

RAYMOND F. HOSSFELD, Primary Examiner

U.S. Cl. X.R.

250—213; 317—235